United States Patent [19]

Schroeder

[11] Patent Number: 4,833,417

[45] Date of Patent: May 23, 1989

[54] SYNCHRONOUS DEMODULATION SYSTEM WITH DIGITAL OUTPUT

[75] Inventor: Werner Schroeder, Bleichheim, Fed. Rep. of Germany

[73] Assignee: LITEF GmbH, Freiburg im Breisgau, Fed. Rep. of Germany

[21] Appl. No.: 134,689

[22] Filed: Dec. 18, 1987

[30] Foreign Application Priority Data

Dec. 19, 1986 [EP] European Pat. Off. ........ 86117743.4

[51] Int. Cl.$^4$ ............................................. H03D 1/06
[52] U.S. Cl. ...................................... 329/50; 329/169; 455/245
[58] Field of Search ................ 455/245, 309; 329/122, 329/124, 131, 132, 50, 168, 169

[56] References Cited

U.S. PATENT DOCUMENTS 3,265,980  8/1966  Thompson ...................... 329/50 X
4,456,376  6/1984  Carrington et al. ................. 356/350

FOREIGN PATENT DOCUMENTS 0168292  1/1986  European Pat. Off. .
3140110  4/1983  Fed. Rep. of Germany .
3233829  3/1984  Fed. Rep. of Germany .

OTHER PUBLICATIONS

Article: "Direct Rotation-Rate Detection with a Fibre-Optic Gyro by Using Digital Data Processing", *Electronic Letters*, vol. 19, No. 23, Nov. 1983, pp. 997–999.

"Demodulation Circuit", *Patent Abstracts of Japan*, vol. 6, No. 72, May 1982 (Japanese Pat. No. 57-10506, 1-2-0-1982, Yoshida).

Primary Examiner—Siegfried H. Grimm
Attorney, Agent, or Firm—Elliott N. Kramsky

[57] ABSTRACT

A synchronous demodulation system with digital signal output contains a summation circuit receiving an input signal to be demodulated and a control signal. The output of the summation circuit is applied to a synchronous demodulator which feeds into a controller. The controller comprises an integrator, which precedes an A/D converter and a processor that acquires the output pulses of the A/D converter. The processor drives a D/A converter supplying the control signal to the summation circuit so that the summation of the input signal and the output of the D/A converter, averaged over time, leads to an (approximately) zero signal in the synchronous demodulator. Due to digital control the circuit is distinguished by a large dynamic range and high accuracy with simultaneous insensitivity.

4 Claims, 2 Drawing Sheets

SYNCHRONOUS DEMODULATION SYSTEM WITH DIGITAL OUTPUT

BACKGROUND

1. Field of the Invention

The present invention relates to demodulators. More particularly, this invention pertains to a synchronous demodulation system that provides a digital output.

2. Background of the Prior Art

The need to demodulate a measurement signal (e.g. a signal of higher frequency) over a relatively broad dynamic range such as five or seven decades often arises in instrumentation and control engineering. An example of a measurement signal having a large dynamic range is that provided by a fiber optic gyroscope, the output of which must be measured with great accuracy over a very large dynamic range with respect to the amplitudes of one or more frequency components.

Known synchronous demodulators and analog/digital converters (A/D converters) often experience difficulties as a result of the fact that on the one hand, they do not operate linearly at relatively high signal amplitudes while, on the other hand, their zero stabilities are inadequate at very low signals.

SUMMARY AND OBJECTS OF THE INVENTION

It is therefore an object of the present invention to provide a synchronous demodulation system with digital output that possesses a very large dynamic range, high linearity and zero stability.

The foregoing objects and advantages, and others, are achieved by the present invention that provides a synchronous demodulation system for demodulating a signal and providing a digital output. The demodulation system includes an analog adder that is arranged to receive such signal and a control signal of the same frequency. A synchronous demodulator is arranged to receive the output of the adder. A digital controller accepts the output of the demodulator, producing a digital output in response to the voltage of the signal to be demodulated. A digital-to-analog converter is arranged to be driven by the controller in synchronism with the signal. The output amplitude of the converter is adjustable in discrete steps in response to the digital output of the controller so that the demodulator output becomes zero in the mean.

The foregoing features and advantages of this invention will become further apparent from the detailed description that follows. This description is accompanied by a set of drawing figures. Numerals of the written specification and the drawings point to the features of this invention, like numerals referring to like features throughout.

DETAILED DESCRIPTION

Figure 1:
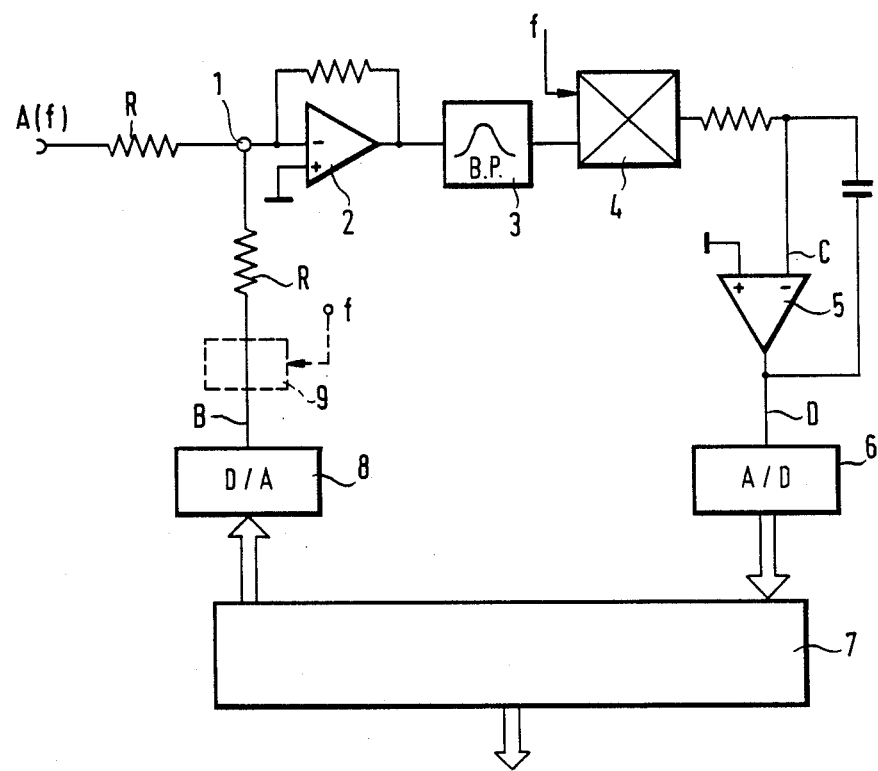
FIG. 1 is a schematic diagram of a synchronous demodulation system in accordance with the invention.

FIG. 1 is a schematic diagram of the synchronous demodulation system of the invention. In accordance with the diagram, a signal of the form $A \cdot \sin 2\pi f \cdot t$ and a generally intermittent alternating rectangular signal of variable amplitude B and frequency f from a digital-/analog converter (D/A converter) 8 are applied to a summation point 1 so that, after summation in an adder 2 and demodulation in a synchronous demodulator 4 by means of a control loop formed of an integrator 5, an analog/digital converter (A/D converter) 6 and a processor 7, the (high) frequency signal of frequency f is averaged over time to (approximately) zero at the summation point 1.

A bandpass filter 3 located between the adder 2 and the synchronous demodulator 4 is tuned to the frequency f. As an alternative to generating the alternating rectangular signal by means of the D/A converter 8, such signal can be generated by means of a polarity reversing circuit 9. In the alternative arrangement, the amplitude of the alternating signal is supplied by the D/A converter 8.

An iterative algorithm is utilized reset to a minimum value that is determined by the resolution of the A/D converter 6. The steps of such algorithm regulate the charge supplied to the integrator 5 by the voltage of the demodulated signal, $A \cdot \sin 2\pi f \cdot t$ so that, in the mean, it is equal to the digitized charge due to the signal B.

Figure 2:
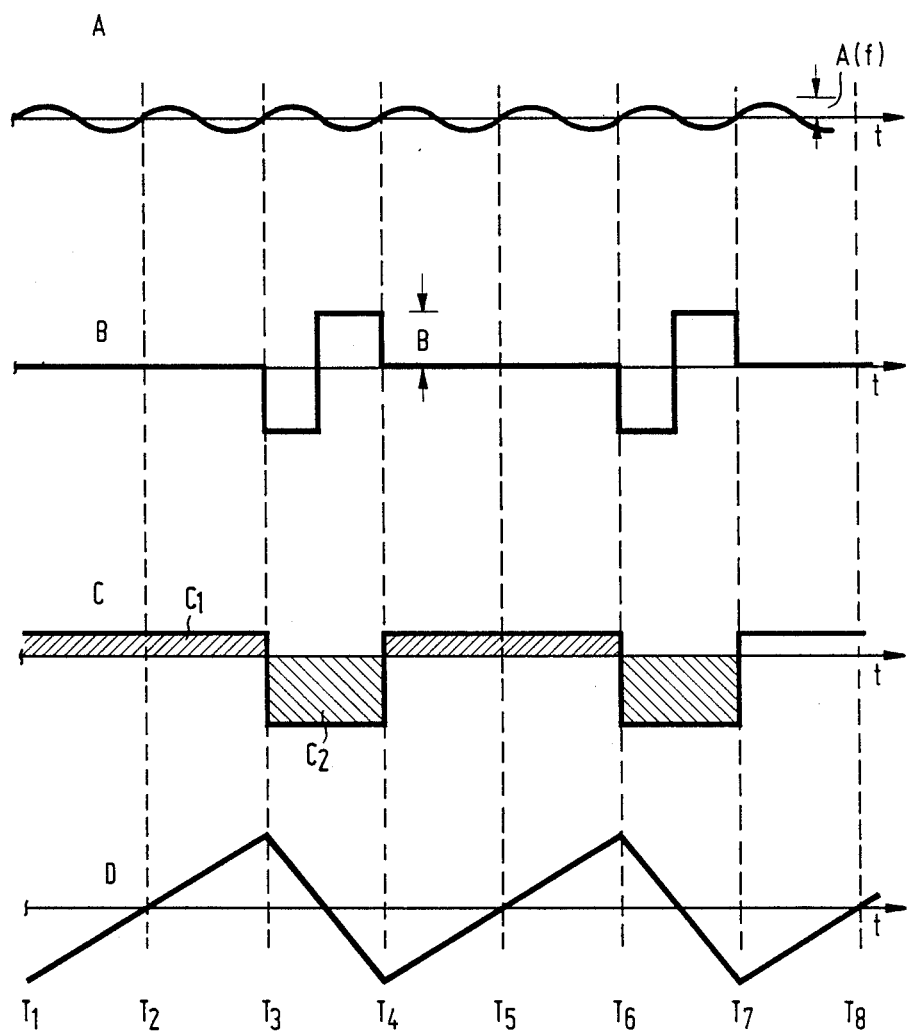
FIG. 2 comprises a set of waveforms for illustrating the operation of the invention.

FIG. 2 comprises a set of waveforms that illustrate the operation of the circuit of the FIG. 1. As shown at A in FIG. 2, a signal of frequency f and slightly fluctuating, approximately constant amplitude A is present at the input. A signal of relatively large amplitude B is added in every third period at the summation point 1 in accordance with the resolution of the D/A converter 8. During the intermediate periods, the switching threshold of the converter 8 is not exceeded and, therefore, no signal of amplitude B is provided.

After band filtering, the signal summed in the adder 2 is demodulated in the demodulator 4 to provide a signal C. As shown in the third line of FIG. 2, the areas $C_1$ and $C_2$ are (approximately) equal, only the DC components being shown in the case represented. The signal C at the output of the demodulator 4 is applied to the integrator 5. A signal D, corresponding to the signal C, appears at the output of the bipolar integrator 5. The signal D is ramp-shaped in accordance with the sign of the input signal C. The integrator output signal is converted by A/D converter 6 into a digital signal thereby permitting the processor 7 to recognize when a rising or falling ramp exceeds a particular threshold value. When the switching threshold of the A/D converter 6 is exceeded, a "signal" is provided to the processor 7 to thereby increment or decrement the amplitude B of the D/A converter 8 by one bit in accordance with the sign of the intermittent resetting signal at the output of the A/D converter 6.

The resetting principle utilized in the invention overcomes the limitations of prior art demodulators operating at high dynamic ranges (i.e. poor linearity at high signal amplitudes and unsatisfactory zero stability at low signals) by continuously monitoring the input signal with respect to changing amplitude and "resetting". In this way the properly-tuned demodulator always operates around zero, permitting highly-preamplified signals. The zero stability of the demodulator influences total accuracy to a lesser degree than occurs when the input signal is directly demodulated.

The resetting principle provides digital measurement signals from which rotation rate can be continuously calculated by computer by employing known algorithms (e.g. for fiber optic gyroscopes) in open-loop calculations. Alternatively, the amplitude of phase modulation can be controlled by means of the invention.

The following table illustrates various relevant relationships for the case in which the root mean square value of the amplitude of the input signal A=0.33 mV. The resolution (i.e. least significant bit) of the D/A converter 8 and of the A/D converter 6 is assumed to by 1 mV. (The table refers to the diagram of FIG. 2.)

| Clock | A = const. | Output B D/A converter | Output C integrator | Comments |
|---|---|---|---|---|
| $T_1$ | 0.33 mV | 0 mV | −1 mV | Assumption |
| $T_2$ | 0.33 mV | 0 mV | 0 mV | |
| $T_3$ | 0.33 mV | −1 mV | −1 mV | C = 1 mV ≃ threshold ↑ A/D converter ↓ D/A amplitude is incremented by 1 bit |
| $T_4$ | 0.33 mV | 0 mV | −1 mV | C = −1 mV ≃ lower threshold ↓ of the A/D converter ↓ D/A amplitude is incremented by 1 bit |
| $T_5$ | 0.33 mV | 0 mV | 0 mV | |

Assuming an i-bit D/A converter 8 and bipolar operation, $2^{(i-1)}$ amplitudes are possible for signal B. That is to say, $$B = b \times 2^{(i-1)},$$

where b=least significant bit of the D/A converter (e.g. 1 mV)

It can be seen that the number of (rectangular) periods required for resetting is equal to f per second (including rectangular periods of zero amplitude). When the input signal rises, for example, by one decade, the integrator 5 supplies a ramp signal D to the A/D converter 6 that, under certain circumstances, may rise over several periods. The A/D converter 6 provides this information as a correction signal to the processor 7 that, in turn, corrects the D/A converter 8 by a number of steps which corresponds to the resolving capability of the D/A converter 8. At the same time, the output (signal B) of the D/A converter includes information on the input amplitude. The digital values supplied by the processor to the D/A converter 8 may be directly output as pulses. Thus the circuit also functions as a voltage/frequency converter.

"Fast" switching, if possible, may be achieved by suitably increasing the step size of the D/A converter output amplitude change when the input amplitude change at the A/D converter is great over a clock cycle. The step size might be made equal to the digitized A/D converter signal, with a "zero" voltage input corresponding to a "zero" step size and positive and negative voltages corresponding to positive and negative step sizes, respectively.

In contrast to conventional synchronous demodulators, the invention offers numerous advantages. A number of the more significant advantages include the following: (1) linearity problems are eliminated since, in the mean, the demodulator is operated with very small signals; (2) the gain stabilities of the band filter 3 and the demodulator 4 are of virtually no significance; (3) the control electronics are of digital design; and (4) the A/D converting demodulator is of very large dynamic range.

Thus it is seen that the invention provides a synchronous demodulation system with digital output that possesses a very large dynamic range, high linearity and zero stability. As such, the invention is particularly suitable for open-loop fiber optic gyroscopes.

While this invention has been disclosed with reference to its presently-preferred embodiment, it is not limited thereto. Rather, the invention is limited only insofar as defined by the following set of claims and includes all equivalents within its scope.

What is claimed is:

1. A synchronous demodulation system for demodulating an input signal and providing a digital output comprising, in combination:
   (a) an analog adder, said adder being arranged to receive said input signal and a control signal of the same frequency;
   (b) a synchronous demodulator, said demodulator being arranged to receive the output of said adder;
   (c) a digital controller, said controller being arranged to accept the output of said demodulator and to produce a digital output in response to the voltage of said input signal to be demodulated;
   (d) a digital-to-analog converter, said digital-to-analog converter being arranged to be driven by said controller in synchronism with the frequency of said input signal to produce said control signal; and
   (e) the output amplitude of said converter being adjustable in discrete steps in response to the digital output of said controller so that said demodulator output becomes zero in the mean.

2. A synchronous demodulation system as defined in claim 1 wherein said digital controller further comprises:
   (a) an analog integrator, said integrator being arranged to accept the output of said demodulator;
   (b) an analog-to-digital converter, said converter being adapted to receive the output of said integrator;
   (c) a signal processor in connection with said analog-to-digital converter; and
   (d) said digital-to-analog converter is of the bipolar type; and
   (e) said digital-to-analog converter is synchronized with the frequency of said input signal.

3. A synchronous demodulation system as defined in claim 2 wherein said processor further comprises:
   (a) means for checking the threshold of said analog-to-digital converter; and
   (b) means for providing a step-by-step correction of the output amplitude of said digital-to-analog converter to maintain the output of said analog-to-digital converter below a predetermined threshold switching value.

4. A synchronous demodulation system as defined in claim 1 further including:
   (a) a band filter for filtering the input to said demodulator; and
   (b) said band filter is tuned to the frequency of said input signal.

* * * * *